United States Patent [19]

Harada et al.

[11] Patent Number: 5,388,751
[45] Date of Patent: Feb. 14, 1995

[54] WIRE CLAMPER

[75] Inventors: Kouichi Harada; Kuniyuki Takahashi, both of Tokyo, Japan

[73] Assignee: Kabushiki Kaisha Shinkawa, Tokyo, Japan

[21] Appl. No.: 190,308

[22] Filed: Feb. 2, 1994

[30] Foreign Application Priority Data

Mar. 9, 1993 [JP] Japan ............................ 5-072855

[51] Int. Cl.6 ............................................ H01L 21/60
[52] U.S. Cl. .......................................... 228/4.5; 228/8; 228/49.5
[58] Field of Search ............... 228/4.5, 8, 49.5, 103, 228/180.5, 212; 269/224, 254 R, 903

[56] References Cited

U.S. PATENT DOCUMENTS 5,176,310 1/1993 Akiyama et al. ............... 228/180.5
5,314,175 5/1994 Izumi et al. ...................... 269/224
5,323,948 6/1994 Yamazaki et al. ................ 228/4.5

FOREIGN PATENT DOCUMENTS 61-2294 1/1986 Japan ........................... H01L 21/60

Primary Examiner—Samuel M. Heinrich
Attorney, Agent, or Firm—Koda and Androlia

[57] ABSTRACT

A wire clamper for wire bonding apparatuses including a pair of clamping arms provided with clamping elements at the terminal ends of the clamping arms that are opened and closed by the electrostrictive strain effect or magnetstrictive strain effect of a piezoelectric element, and a temperature compensation component is connected to the piezoelectric element so as to correct the fluctuation in the clamping load in the clamping elements that are caused by temperature changes in the clamper.

5 Claims, 2 Drawing Sheets

WIRE CLAMPER

BACKGROUND OF THE INVENTION

1. Field of the Invention

The present invention relates to a wire clamper used in a wire bonding apparatus.

2. Prior Art

The Japanese Patent Application Publication (Kokoku) No. 61-2294 discloses one example of the conventional wire clamper.

The clamper includes a movable arm and a fixed arm, and the movable arm is urged toward the fixed arm by a spring. The movable arm is opened and closed by a solenoid. When the solenoid is actuated, the projecting rod of the solenoid pushes the movable arm overcoming the driving force of the spring, and as a result, the movable arm is opened. When the solenoid is turned off, the movable arm is closed by the spring so that the movable arm is closed and clamps a bonding wire between the movable and fixed arms.

In this prior art, the clamper arms are operated via the solenoid provided on the clamper. Accordingly, the overall weight of the clamper is large, and the response of the clamper tends to be slow. Meanwhile, the load applied onto the bonding wire (i.e., the clamping load) to hold the bonding wire is provided by a spring force of approximately 40 to 50 gr. Thus, when a bonding head upon which the clamper is installed is moved fast, the arms of the clamper tends to rattle, causing the clamping load to be unstable.

In addition, the amount of the clamping load depends on the spring. As a result, when the clamping load is to be changed, it is necessary to replace the spring. It is, however, difficult to obtain a desired clamping load by changing the spring, and considerable time is required for the adjustment of the load.

The inventor of the present patent application previously filed a patent application for a device that solves the problems as described above (Serial No. 08/031,237 based upon Japanese Patent Application No. 4-87454). In this device, the clamper has a pair of open/close arms so as to hold a bonding wire when the arms are closed, and at least one of the arms is opened and closed by the electrostrictive strain effect or magnetstrictive strain effect of a piezoelectric element.

Since the arms in this device are opened and closed by a piezoelectric element, the weight and response characteristics of the wire clamper can respectively be small and conspicuously high. In addition, since the clamping load is obtained from a piezoelectric element, the components for clamping the bonding wire do not rattle even when the bonding head moves fast. Also, since the clamping load can be changed by varying the voltage applied to the piezoelectric element, any desired clamping load can easily be obtained.

However, various prototypes and experiments of such a clamper made and conducted by the inventors unveiled several problems. Generally, in a wire bonding apparatus, a capillary is located beneath the wire clamper, and a heating block which heats a workpiece is located beneath the capillary. Accordingly, when the heating block is heated, the heat of the heating block causes the temperature of the wire clamper to rise by approximately 20° C. When the temperature of the wire clamper rises, the clamping elements provided at the end of the arms move in the direction to close the arms. This results in an increase of the clamping load. Accordingly, when opening the wire clamper, a higher value of voltage must be applied to the piezoelectric element. In this case, it is often necessary to increase the voltages up to the permissible upper limit of the piezoelectric element. Thus, there is a danger that the piezoelectric element will not work properly.

SUMMARY OF THE INVENTION

Accordingly, the object of the present invention is to provide a wire clamper which can prevent clamping load fluctuations that is caused by changes in temperature.

The wire clamper of the present invention includes a pair of clamper arms that can open and close and a pair of clamping elements that are respectively provided at terminal ends of the clamper arms in order to hold a bonding wire in between, and the feature of the structure for accomplishing the object is that at least one of the clamper arms is designed to be moved so as to open and close by the electrostrictive strain effect or magnetstrictive strain effect of a piezoelectric element, and a temperature compensating means is further provided near the piezoelectric element so as to correct the fluctuation in the clamping load of the clamping elements that are caused by temperature changes.

With the temperature compensating means installed for the piezoelectric element, the wire clamper is not affected by temperature changes.

DETAILED DESCRIPTION OF THE INVENTION

An embodiment of the present invention will be described with reference to FIGS. 1 through 3.

Figure 1:
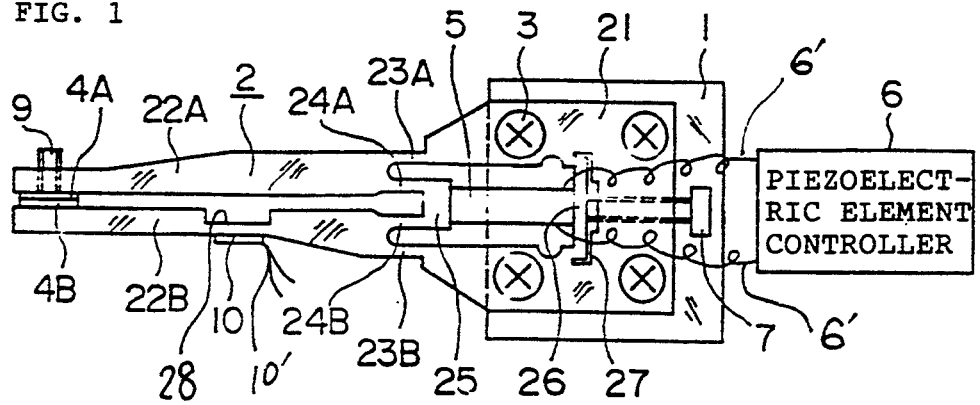
FIG. 1 is a top view of a wire clamper to which the present invention is applied.

As shown in FIG. 1, a clamper main body 2 is mounted to a clamper support 1 by screws 3. The clamper support 1 is fastened to the bonding head of a bonding apparatus (not shown).

The clamper main body 2 comprises a base portion 21 which is fixed to the clamper support 1 by the screws 3 and a pair of clamper arms 22A and 22B. To the terminal ends of the pair of clamper arms 22A and 22B, clamping elements 4A and 4B are respectively attached.

Two first narrow portions 23A and 23B which are capable of making an elastic deformation are formed in the area that connects the base portion 21 and the clamper arms 22A and 22B. In addition, two second narrow portions 24A and 24B are formed on the clamper arms 22A and 22B so that they are located inside (when viewed above the FIGS. 1 and 3) the first narrow portions 23A and 23B. These second narrow portions 24A and 24B are connected together to form an operating portion 25. The first and second narrow portions 23A, 23B, 24A and 24B are formed so that they have a spring force which acts in a direction in which the clamping elements 4A and 4B are closed.

A slit groove 27 is formed in the base portion 21 of the clamper main body 2 so as to confront the operating portion 25, thus making a deformable diaphragm section 26.

A laminated piezoelectric actuator (hereinafter called "piezoelectric element") 5 is provided between the operating portion 25 and the diaphragm section 26 and connected to these two elements at both ends. The piezoelectric element 5 is actuated by a piezoelectric element controller 6 via two electrical lines 6'. The piezoelectric element 5 is installed so that its strain direction is oriented in the direction of the clamping surfaces of the clamping elements 4A and 4B.

A clamping load adjustment means or screw 7 is screwed into the base portion 21 of the clamper base body 2 so that the screw presses, with its end, against the diaphragm section 26.

Figure 2:
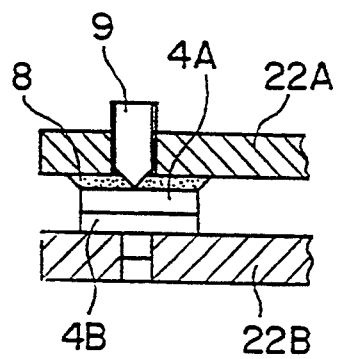
FIG. 2 is an enlarged cross section of the clamping elements used in the wire clamper of FIG. 1.

As shown in FIG. 2, the clamping element 4A is fixed to the clamper arm 22A via an adhesive agent 8, and a clamping element adjustment screw 9 which has a conical or rounded end is screwed into the clamper arm 22A at a location that corresponds to the clamping element 4A. The other clamping element 4B is pressure-fitted into a hole opened in the clamper arm 22B.

The operation of the wire clamper shown in FIG. 1 will be described below:

When voltage is not applied to the piezoelectric element 5, the clamping elements 4A and 4B are in a closed position and clamp a bonding wire (not shown) between them with a fixed clamping load that is provided by the spring force derived from the narrow portions 23A, 23B, 24A and 24B.

When a voltage is applied to the piezoelectric element 5, the piezoelectric element 5 is caused to expand toward the clamping elements 4A and 4B (or to the left in FIG. 1) by the resulting electrostrictive strain effect or magnetostrictive strain effect, and the operating portion 25 is caused to shift in the same direction (i.e., to the left in FIG. 1). As a result, the narrow portions 23A, 23B, 24A and 24B bend outwardly (or up and down in FIG. 1), so that the clamping elements 4A and 4B are opened.

The amount of this movement of the clamping elements 4A and 4B is obtained from (a) the ratio between the length from the operating portion 25 to the narrow portions 23A and 23B and the length from the narrow portions 23A and 23B to the wire-clamping surfaces of the clamping elements 4A and 4B and (b) the amount of extension of the piezoelectric element 5.

Figure 3:
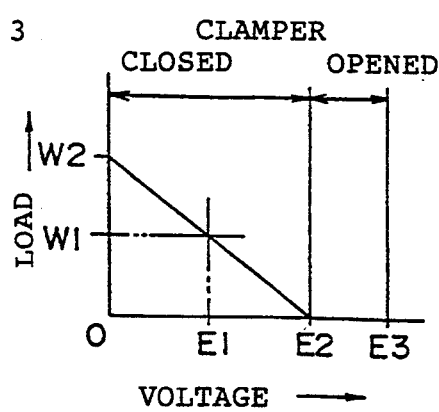
FIG. 3 is a graph showing the relationship between the voltage applied to the piezoelectric element and the clamping load.

The above-described matter may be described in greater detail as follows:

As shown in FIG. 3, when a voltage is applied to the piezoelectric element 5 beginning from a state where the voltage applied to the piezoelectric element 5 is zero and the clamping load is W2, the clamping load decreases in proportion to the increase in the voltage applied. When the voltage reaches E2, the clamping elements 4A and 4B are in contact with the bonding wire but the clamping load is zero. If the voltage is increased further, the clamping elements 4A and 4B are opened.

Accordingly, a desired clamping load W1 for clamping the bonding wire is obtained by applying a voltage of E1. In other words, a clamping load at a desired level can be set by ascertaining beforehand the relationship between the voltage and the clamping load, and then lowering the voltage by a given amount from the voltage value where the clamping elements 4A and 4B just come to contact the bonding wire (i.e., the voltage value where the clamping load is zero). Accordingly, in actual use, the voltage during wire clamping is set at E1, and the voltage when the bonding wire is released is set at E3.

To give one concrete example, a wire clamper may be constructed so that the clamping load W2 is approximately 80 to 100 gr when the voltage is zero and so that the clamping elements 4A and 4B are separated to open for a distance of approximately 50 to 70 microns when the voltage E3 is 100 V. In this case, the clamping load W1 is approximately 40 to 50 gr when the voltage E1 is approximately 50 to 60 V.

As seen from the above, the clamper arms 22A and 22B are operated by the piezoelectric element 5. Accordingly, the following effects are obtained:

(1) The weight of the piezoelectric element is light, and the one used in the embodiment is approximately 0.5 to 5 gr though the solenoids used in a conventional device weigh approximately 20 to 30 gr. Accordingly, weight reduction is secured.

(2) The response time of the solenoid is 1.5 to 2.0 ms, while that of the piezoelectric element 5 is 0.05 to 0.3 ms. Accordingly, the response time is conspicuously improved.

(3) In conventional devices, the clamping load is obtained via the driving force of a spring. Thus, the clamping elements can shake when the bonding head moves at a high speed.

In the present embodiment, on the other hand, since the driving force of the piezoelectric element 5 is large, the narrow portions 23A, 23B, 24A and 24B of the clamper arms 22A and 22B can be rigid. Accordingly, the clamping elements 4A and 4B will not shake even when the bonding head moves at a high speed. Thus, a stable clamping load is assured.

(4) In the present embodiment, the clamping load is obtained based upon the voltage applied to the piezoelectric element 5. Accordingly, clamping load at any desired level can easily be set.

A method which allows easy and accurate measurement and setting of the clamping load will be described below.

A cut-out 28 which provides an elastic deformation is formed on one side (or inner side) of the clamper arm 22B near the clamping element 4B, and a strain gauge 10 having outwardly extended wires 10' is attached to the other (or outer) side of the cut-out 28. With this structure having the strain gage 10, it is possible to know the relationship between the amount of bend of the cut-out 28 and the clamping load provided by the output value of the strain gauge 10, since the amount of bend of the cut-out 28 varies depending upon the clamping load.

Thus, by measuring before the relationship between the output value of the strain gauge 10 and the clamping load, the voltage to be applied to the piezoelectric element 5 can be adjusted via the output value of the strain gauge 10 so that the clamping load is controlled.

Figure 4:
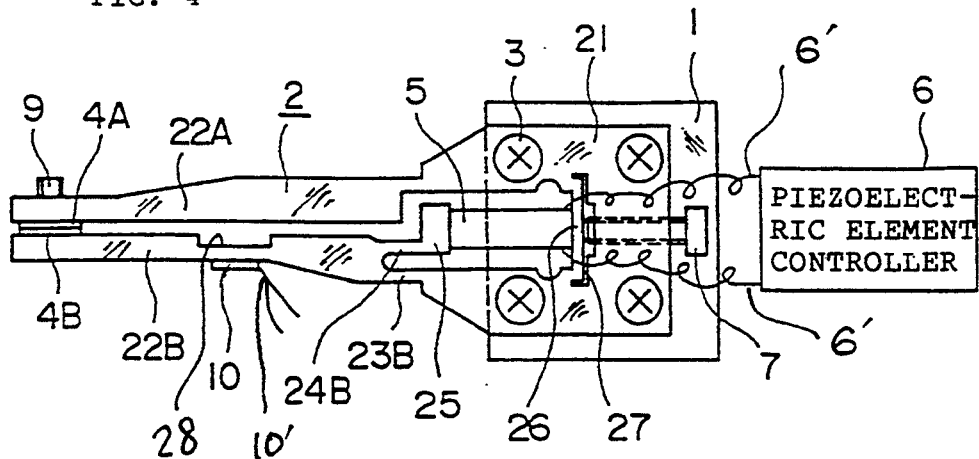
FIG. 4 is a top view of another type of wire clamper to which the present invention is applied.

FIG. 4 illustrates a wire clamper of another type. In the first embodiment described above, both of the clamper arms 22A and 22B are bent when they are opened and closed. In this embodiment in FIG. 4, on the other hand, only the clamper arm 22B is bent.

More specifically, there is no narrow portion 23A that is used in the first embodiment. Instead, this portion is made rigid. The clamper arm 22A is not continuous from the operating portion 25. Accordingly, only the clamper arm 22B bends in this embodiment.

An effect similar to that obtained in the previous embodiment can be obtained using this structure as well. However, in this embodiment, since only the clamper arm 22B bends, it may be hard (depending on the capacity of the piezoelectric element 5 used) to obtain a desired amount of opening. A larger amount of opening can be obtained in the structure in which both clamper arms 22A and 22B are bendable. Accordingly, such an arrangement is rather desirable.

Next, a temperature compensating means used in the wire clamper will be described below:

In the clampers shown in FIGS. 1 and 4, where $B_1$ is the linear expansion coefficient of the clamper main body 2, $B_2$ is the linear expansion coefficient of the piezoelectric element 5, a is the length of the piezoelectric element 5 and $\Delta t$ is the temperature change, then the narrow portions 23A and 23B will expand more than the piezoelectric element 5 by an amount equal to $a(\beta_1-\beta_2) \Delta t$ since $B_1$ is greater than $B_2$. As a result, the clamping elements 4A and 4B will deform in the direction of closing which causes the clamping load to increase. Accordingly, even if a given level of voltage is applied to the piezoelectric element 5, the required amount of opening of the clamping elements is not insured.

Figure 5:
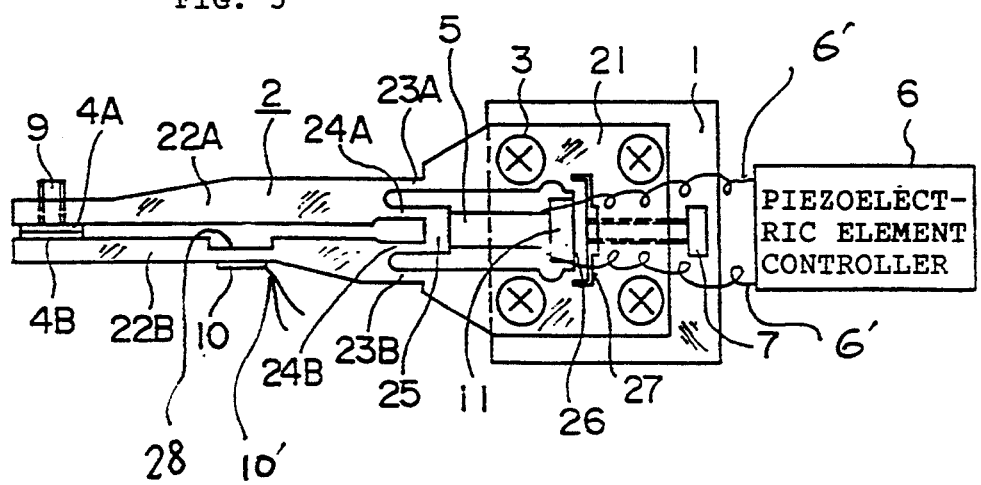
FIG. 5 is a top view showing one embodiment of the wire clamper according to the present invention.

FIG. 5 shows a wire clamper having a temperature compensating component which corrects for the fluctuation in the clamping load that is caused by the temperature change or temperature rise.

A temperature compensation component 11 is attached to the piezoelectric element 5, and these two elements (the piezoelectric element 5 and temperature compensation component 11) are attached between the operating section 25 and diaphragm section 26.

With this structure having the temperature compensation component 11, if it is assumed that $B_3$ is the linear expansion coefficient of the temperature compensation component 11 and b is the length of the temperature compensation component 11, then the expansion $L_1$ of the piezoelectric element 5 and temperature compensation component 11 will be as shown in Equation 1 below, and the expansion $L_2$ of the narrow portions 23A and 23B of the clamper main body 2 will be as shown in Equation 2.

$$L_1 = (a\beta_2 + b\beta_3)\Delta t \qquad \text{Equation 1}$$

$$L_2 = (a+b)\beta_1 \Delta t \qquad \text{Equation 2}$$

Accordingly, if the linear expansion coefficient $\beta_3$ and length b of the temperature compensation component 11 are selected so that the condition $L_1 = L_2$, i.e., the condition $(a\beta_2 + b\beta_3) = (a+b)\beta_1$, is satisfied, the wire clamper will be unaffected by changes in temperature.

To give one concrete example, if the clamper main body is made of titanium (having the linear expansion coefficient $\beta_1 = 8.6 \times 10^{-6}/°$ C.) and the length a of the piezoelectric element 5 (having the linear expansion coefficient $\beta_2 = -3.9 \times 10^{-6}/°$ C.) is 9 mm, the temperature compensation component 11 is made of an aluminum material (having the linear expansion coefficient $B_3 = 23.6 \times 10^{-6}/°$ C.), then the length b of the temperature compensation component 11 may be 7.5 mm.

As seen from FIG. 5, the temperature compensation means is installed at an end of the piezoelectric element 5 so as to be near the diaphragm section 26. However, the temperature compensation means can be installed at the end of the piezoelectric element 5 so as to be near the operating section 25. Furthermore, two temperature compensation means 11 can be installed on both ends of a single piezoelectric element 5 or a single temperature compensation means 11 can be installed between two piezoelectric elements 5 so that they are all located between the operating portion 25 and the diaphragm section 26 of the clamper main body 2.

As seen from the above, according to the present invention, the wire clamper includes a pair of clamper arms that can open and close and a pair of clamping elements that are respectively provided at terminal ends of the clamper arms in order to hold a bonding wire in between; and at least one of the clamper arms is movable so as to open and close by the electrostrictive strain effect or magnetstrictive strain effect of a piezoelectric element, and a temperature compensating means is further provided so as to correct the fluctuations in the clamping load of the clamping elements caused by temperature changes. Accordingly, the fluctuation in the clamping load caused by temperature change can be prevented.

We claim:

1. A wire clamper used in a wire bonding apparatus characterized in that said wire clamper comprises: a pair of clamper arms which open and close and a pair of clamping elements that are respectively provided on said clamper arms so as to clamp a bonding wire; wherein at least one of said clamper arms is opened and closed by an electrostrictive strain effect or magnetstrictive strain effect of a piezoelectric element, and a temperature compensating means is installed which corrects for fluctuation in a clamping load of said clamper elements that are caused by temperature changes.

2. A wire clamper for a bonding apparatus comprising:
a clamper main body mounted at a root end thereof to a clamper support of said bonding apparatus, said clamper main body including a pair of clamping arms extending from said root end of said clamper main body with narrow portions and an operating portion between said root end and said clamper arms;
a pair of clamping elements provided at terminal ends of said clamper main body;
a piezoelectric element installed between said root end and said operating portion of said clamper main body; and
a temperature compensating means installed so as to be connected to said piezoelectric element.

3. A wire clamper according to claim 2, wherein said temperature compensating means is installed between said piezoelectric element and said diaphragm section of said clamper main body.

4. A wire clamper according to claim 2, wherein said temperature compensating means is installed between two piezoelectric elements which are provided between said operating portion and a diaphragm section of said clamper main body.

5. A wire clamper according to claim 2, wherein said temperature compensating means are provided on both ends of said piezoelectric elements between said operating portion and a diaphragm section of said clamper main body.

* * * * *